US009059008B2

(12) United States Patent
Lin et al.

(10) Patent No.: US 9,059,008 B2
(45) Date of Patent: Jun. 16, 2015

(54) RESURF HIGH VOLTAGE DIODE

(71) Applicants: Xin Lin, Phoenix, AZ (US); Daniel J. Blomberg, Chandler, AZ (US); Hongning Yang, Chandler, AZ (US); Jiang-Kai Zuo, Chandler, AZ (US)

(72) Inventors: Xin Lin, Phoenix, AZ (US); Daniel J. Blomberg, Chandler, AZ (US); Hongning Yang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/656,103

(22) Filed: Oct. 19, 2012

(65) Prior Publication Data

US 2014/0110814 A1 Apr. 24, 2014

(51) Int. Cl.
*H01L 29/66* (2006.01)
*H01L 29/06* (2006.01)
*H01L 29/739* (2006.01)

(52) U.S. Cl.
CPC .......... *H01L 29/063* (2013.01); *H01L 29/0692* (2013.01); *H01L 29/66356* (2013.01); *H01L 29/7391* (2013.01)

(58) Field of Classification Search
CPC . H01L 29/8611; H01L 29/808; H01L 29/872; H01L 29/66128; H01L 29/66681; H01L 29/7801; H01L 29/861; H01L 21/329
USPC ........... 257/492–496, 46, 355, 481, 566, 591, 257/547, 335–336; 438/492, 286, 307, 361, 438/9
See application file for complete search history.

(56) References Cited

U.S. PATENT DOCUMENTS

| | | | | |
|---|---|---|---|---|
| 5,241,210 | A | 8/1993 | Nakagawa et al. | |
| 5,294,825 | A | 3/1994 | Nakagawa et al. | |
| 5,378,920 | A | 1/1995 | Nakagawa et al. | |
| 6,303,954 | B1 | 10/2001 | Ohoka | |
| 7,095,092 | B2 * | 8/2006 | Zhu et al. | 257/506 |
| 7,466,006 | B2 | 12/2008 | Khemka et al. | |
| 7,489,007 | B2 * | 2/2009 | Williams et al. | 257/335 |
| 7,936,023 | B1 * | 5/2011 | Jang et al. | 257/373 |
| 8,492,866 | B1 * | 7/2013 | Anderson et al. | 257/481 |
| 2004/0135141 | A1 * | 7/2004 | Pequignot et al. | 257/46 |
| 2008/0023767 | A1 * | 1/2008 | Voldman | 257/355 |
| 2008/0061367 | A1 * | 3/2008 | Williams et al. | 257/336 |
| 2011/0084354 | A1 | 4/2011 | Honda et al. | |
| 2011/0140199 | A1 | 6/2011 | Miyoshi et al. | |
| 2012/0043608 | A1 * | 2/2012 | Yang et al. | 257/336 |
| 2012/0211869 | A1 * | 8/2012 | Lee et al. | 257/547 |
| 2013/0082353 | A1 * | 4/2013 | Kuo et al. | 257/591 |

* cited by examiner

*Primary Examiner* — Mohammed Shamsuzzaman
(74) *Attorney, Agent, or Firm* — Terrile, Cannatti, Chambers & Holland, LLP; Michael Rocco Cannatti

(57) ABSTRACT

A trench-isolated RESURF diode structure (100) is provided which includes a substrate (150) in which is formed anode (130, 132) and cathode (131) contact regions separated from one another by a shallow trench isolation region (114, 115), along with a buried cathode extension region (104) formed under a RESURF anode extension region (106, 107) such that the cathode extension region (104) extends beyond the cathode contact (131) to be sandwiched between upper and lower regions (103, 106, 107) of opposite conductivity type.

9 Claims, 4 Drawing Sheets

RESURF HIGH VOLTAGE DIODE

BACKGROUND OF THE INVENTION

1. Field of the Invention

The present invention is directed in general to integrated circuit devices and methods for manufacturing same. In one aspect, the present invention relates to the manufacture and use of high voltage diode devices employing reduced surface field (RESURF) structures.

2. Description of the Related Art

High-voltage integrated circuits applications, such as high-voltage smart power applications, are constructed with integrated circuit diode devices which must be able to sustain high voltages (e.g., ninety volts or greater). Unfortunately, high voltage diodes typically consume a large silicon area which becomes a significant cost factor in more advanced technologies. In addition, there are typically tradeoffs posed when integrating diode devices between the on-resistance and breakdown voltage parameters of such devices, where the on-resistance is ideally kept low and the breakdown voltage is ideally kept high. For example, a design for a diode device which increases the device breakdown voltage typically also increases the on-resistance, which is undesirable.

BRIEF DESCRIPTION OF THE DRAWINGS

The present invention may be understood, and its numerous objects, features and advantages obtained, when the following detailed description is considered in conjunction with the following drawings, in which.

Figure 1:
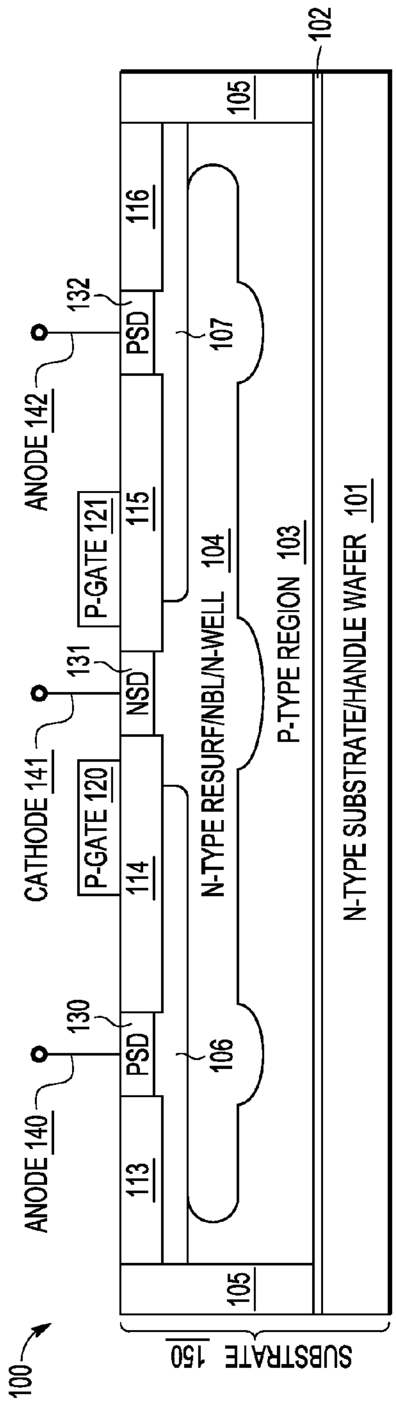
FIG. 1 is a partial cross-sectional view of a high voltage diode device having a RESURF anode extension structure formed over a cathode extension structure which extends past the anode contact without reaching a deep trench isolation structure in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A trench-isolated RESURF diode structure is described for use with high voltage smart power applications. The disclosed RESURF diode structure is isolated from, other circuitry by a surrounding deep trench isolation structure and buried insulation layer, and includes anode and cathode contact regions separated from one another by a shallow trench isolation region. A buried cathode extension structure is formed under a RESURF anode extension structure such that the cathode extension structure extends beyond the cathode contact to be sandwiched between upper and lower region of opposite conductivity type. In some embodiments, the buried cathode extension structure extends all the way to the surrounding deep trench isolation structure, while in other embodiments, the buried cathode extension structure extends only part way to the surrounding deep trench isolation structure. In this case, the buried cathode extension structure can end below the shallow trench isolation between the cathode and anode contacts or below the anode contact. It can even extend beyond the anode contact towards the deep trench isolation. In any case, the RESURF anode extension structure extends under the shallow trench isolation region between the cathode and anode contacts to form p-n junction area for sustaining a large breakdown voltage. For example, an n-type cathode extension structure is positioned in relation to a p-type RESURF anode extension structure to mutually deplete one another to evenly distribute the potential drop across the large p-n junction formed therebetween. In some embodiments, a poly gate is placed on top of the shallow trench isolation between the cathode and anode contacts, where the poly gate is positioned to cover the p-n junction formed with the cathode and anode regions, and is biased with either the anode or cathode potential.

In this disclosure, an improved system, apparatus, and fabrication method are described for a high voltage RESURF diode that address various problems in the art where various limitations and disadvantages of conventional solutions and technologies will become apparent to one of skill in the art after reviewing the remainder of the present application with reference to the drawings and detailed description provided herein. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a high voltage RESURF diode device 100 having one or more anode extension structures 106, 107 formed over a cathode extension structure 104 which extends past the anode contact 130, 132 without reaching a deep trench isolation structure 105. Though the various structures, well, and layer regions are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted diode device structure 100 is formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

The depicted RESURF diode device 100 is shown as being formed on or as part of a substrate 150 which may be formed as a bulk semiconductor substrate or other substrate in which one or more additional semiconductor layers and/or well rations are formed using epitaxial semiconductor growth and/or selective doping techniques as described more fully hereinbelow. For example, the substrate 150 may be a semiconductor-on-insulator (SOT) type substrate which includes an n-type semiconductor substrate 101, buried insulator layer 102, and p-type semiconductor substrate layer 103. The n-type substrate 101 may be provided as a handling wafer layer fbrmed of a material having a specified conductivity type impurities, such as an n-type, at a predetermined n-doping level (e.g., approximately 2E15 $cm^{-3}$), though any desired dopant type and/or concentration may be used. On the handling wafer 101, an insulator layer 102 and thin substrate seed layer (e.g., 1.5 um thick p-type substrate layer on top of insulator layer 102) may be formed to provide a seed layer for thick epitaxial growth of the p-type semiconductor substrate layer 103, thereby forming the initial SOI substrate structure 150. Alternatively, the SOI substrate structure 150 may be formed by bonding a donor wafer to a handle wafer. With this technique, the n-type semiconductor substrate 101 and at least part of the dielectric layer 102 are provided as a handle wafer which is bonded or otherwise attached to a donor wafer which includes part of the dielectric layer 102 and the p-type semiconductor layer 103 which may be formed in whole or in part as a p-type epitaxial layer. Alternatively and depending on the type of transistor being fabricated, the semiconductor substrate 150 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof. With selected bulk silicon substrate embodiments, the buried insulation layer 102 may be formed by implanting dielectric material (e.g., silicon oxide) at a predetermined energy and depth in the substrate 150.

In the substrate 150, an isolation structure around the active diode area includes patterned shallow trench isolation structure 113-116 and deep trench isolation structure 105 formed over the buried insulation layer 102. As will be appreciated, any desired technique may be used to etch and fill the trench openings with one or more dielectric (and semiconductor) materials. For example, the deep trench isolation structure 105 may be formed in the substrate 150 to surround and isolate the various well regions and active areas in the RESURF diode device 100. In selected embodiments, the deep trench isolation structures 105 are formed using a first etch mask to etch deep trench openings through the underlying buried insulation layer 102 (e.g., by applying anisotropic etching to patterned trench etch mask layer), filling the deep trench openings at the periphery with one or more insulating dielectric layers, filling the deep trench openings in the center with heavily doped n-type poly (not shown), and then polishing or planarizing the insulating dielectric and heavily doped poly layers down to the surface of the substrate 150 to form the deep trench isolation structures 105. In similar fashion, a separate trench mask and etch process may be used to form the shallow trench isolation structure 113-116 in an upper portion of the substrate 150. For example, shallow trench openings may be formed by applying anisotropic etching to a patterned trench etch mask layer, and then forming one or more insulating dielectric layers in the shallow trench openings to form the shallow trench isolation (STI) structures 113-116. The positioning of the STI structures 113-116 is controlled to place an STI structure (e.g., 114 and 115) between a cathode 141 and anode 140 and 142 so that the STI structure is the only isolation between the cathode and anode contacts, in contrast to conventional RESURF diode designs. For example, the STI structures 113, 116 may formed as a single continuous STI structure that loops around the periphery of the RESURF diode device 100 between the anode contact 130, 132 and the deep trench isolation structure 105. In similar fashion, the STI structures 114, 115 may formed as a single continuous STI structure that loops around the RESURF diode device 100 between the cathode contact 131 and the anode contact 130, 132. In this way, the positioning of the STI structures 113-116 is controlled to locate the STI structure (e.g., 114 and 115) over the location of p-n junction between the cathode and anode regions.

In the active area for the RESURF diode device 100, one or more first semiconductor layers 103 is formed having a predetermined thickness with a material having a first conductivity type (e.g., p-type). For example, the first semiconductor layer(s) 103 may be formed in whole or in part with an epitaxial p-type layer 103 having a thickness in the range of approximately 1.5-7 um with a p-type doping concentration (e.g., approximately 1E14 to 1E16 $cm^{-3}$, and more preferably 2E15 $cm^{-3}$), though other dopant types, thicknesses, and/or concentrations may be used. In the first semiconductor layer 103, the anode and cathode regions are separately formed to define a large p-n junction area between a p-type RESURF anode extension layer which is formed over a buried n-type RESURF cathode extension layer, where the p-type RESURF anode extension layer extends towards the cathode contact and underneath an STI structure to help completely deplete the cathode under reverse bias.

In selected embodiments, the anode region includes one or more anode contact regions 130, 132 and anode extension region(s) 106, 107 having the first conductivity type (e.g., p-type). Each anode extension region 106, 107 may be formed as a p-type well region by using a first implant mask to selectively diffuse or implant p-type impurities into the substrate 150 to a predetermined implant energy and dopant concentration (e.g., 5E15 to 5E18 $cm^{-3}$) so as to be located in an upper portion of the substrate 150 and around the subsequently formed P+ anode contact region(s) 130, 132. The first implant mask covers or masks the area of the substrate 150 around the subsequently formed N+ cathode contact region (s) 131 to prevent the p-type impurities from being located in the cathode active area. It will also be appreciated that the p-well regions 106, 107 may be formed before forming the STI regions 113-116. However formed, the doping concentration, implant energy, and junction depth are selected and controlled to form the p-well regions 106, 107 so that they contain the anode contact regions 130, 132 and extend partially underneath the STI regions 114, 115, thereby providing a thin, lightly doped p-type region between the cathode and anode contacts. In each anode extension region 106, 107, an anode contact region 130, 132 may be formed using a second implant mask to implant material having the first conductivity type impurities (e.g., P++ source/drain region) in a predetermined upper region of the substrate 150. As a result, the anode extension region 106, 107 extends from the anode contact 130, 132 to define an anode/cathode junction below the STI region 114, 115.

Below each anode extension region 106, 107, a buried cathode extension region 104 may be formed as a buried layer, RESURF layer, epitaxial layer, n-well region, or the like. In selected implantation embodiments, the cathode extension region 104 is formed as an n-type well region using a second implant mask and implant sequence to selectively implant impurities of the second, opposite conductivity type (e.g., Phosphorous) into the substrate 150 to a predetermined implant energy and dopant concentration (e.g., 5E15 to 0.5E17 $cm^{-3}$) so as to overlap with and extend laterally below the anode extension region(s) 106, 107. By implanting n-type impurities through the patterned (STI) structures 113-116, the resulting profile of the buried cathode extension region 104 may include profile bulges below the cathode contact region where the implanted impurities have more channeling effect. In the absence of any previous counter-doping below cathode contact region, the implanted buried cathode extension region 104 includes an upper portion in the substrate 150 around the subsequently formed N+ cathode contact region (s) 131. To control the lateral extent of the buried cathode extension region 104, the second implant mask covers or masks at least part of the substrate area between the subsequently fbrmed P+ anode contact region(s) 130, 132 and the deep trench isolation structure 105 to prevent the n-type impurities from being located in this area. It will also be appreciated that the n-well region(s) 104 may be formed before forming the STI regions 113-116. However formed, the doping concentration, implant energy, and junction depth are selected and controlled to form the surface of the n-well region 104 to contain the cathode contact regions 131, to extend underneath the STI regions 114, 115 at the substrate surface, and to extend underneath the anode extension regions 106, 107 and past the anode contact region(s) 130, 132. Yet another implant mask and implantation process are used to form the cathode contact regions 131 in the cathode extension region 104 with material having second conductivity type impurities (e.g., N++ source/drain region) in a predetermined upper region of the substrate 150. As a result, the buried cathode region 104 extends past the anode contact 130, 132, but not all the way to the deep trench isolation structure 105, so that it is sandwiched between the p-regions 103, 106, 107. While the buried cathode extension region 104 is shown in FIG. 1 as extending past the anode contact region(s) 130, 132, in other embodiments, the buried cathode extension region 104 may extend only partially underneath the STI regions 114, 115, or may even extend underneath the anode contact region(s) 130, 132.

Though the anode and cathode contact regions 130-132 can be formed using photoresist implant masks to selectively diffuse or implant the appropriate impurities, it will be appreciated that other masking or selective diffusion or implantation techniques may also be used so that these regions are all heavily doped in order to allow for good ohmic contact, and thus may be called ohmic regions on which metal contacts (not shown) may be formed. During back-end processing, one or more anode metallization layer(s) 140, 142 and cathode metallization layer(s) 141 are formed to connect the anode(s) and cathode, respectively.

With the configuration of the RESURF diode device 100, the STI regions 114, 115 provide the only isolation between the cathode contact 131 and anode contacts 130, 132. The RESURF action is promoted by the buried cathode extension region 104 which is formed with an n-type well implant into the cathode active area and the region between the cathode contact 131 and anode contacts 130, 132. In order to further enhance the breakdown voltage, the buried cathode extension region 104 extends beyond the anode active area 130, 132. The RESURF action is also promoted by the anode extension regions 106, 107 which are formed with op-type well implant into the anode active area and the region adjacent to the deep trench 105. The anode extension regions 106, 107 also extend partway into the region between the cathode contact 131 and anode contacts 130, 132, creating a thin and lightly doped p-type region 106, 107 between the cathode contact 131 and anode contacts 130, 132. The resulting n-type cathode extension region 104 and surrounding p-type regions 103, 106, 107 form a large p-n junction, and mutually deplete one another to help evenly distribute the potential over the junction, thereby increasing the breakdown voltage.

Though not required in every embodiment, the RESURF diode device 100 may also include one or more poly gate electrodes 120, 121 which are patterned and positioned on top of the STI regions 114, 115 between the cathode and anode contacts so as to cover the lateral p-n junction formed with the cathode 104 and anode regions 106, 107. As will be appreciated, the poly gate electrodes 120, 121 may be formed as a single continuous poly layer that is biased with the same potential. By applying a bias voltage from either the anode or cathode potential to the poly gate electrodes 120, 121, the breakdown voltage of the diode may be further increased.

While the RESURF diode device 100 includes a large p-n junction formed by surrounding the buried cathode extension region 104 with p-type regions 103, 106, 107 on the top, side and bottom, the performance benefits of increased breakdown voltage and forward current capability are also obtained when the buried cathode extension region in the RESURF diode device extends to contact the deep trench isolation structure. To illustrate these embodiments, reference is now made to FIG. 2 which depicts a partial cross-sectional view of a high voltage RESURF diode device 200 having one or more anode extension structures 206, 207 formed over a cathode extension structure 204 which extends past the anode contact 230, 232 to reach a deep trench isolation structure 205.

Similar to the RESURF diode device 100 shown in FIG. 1, the RESURF diode device 200 may be formed on or as part of a bulk or SOT substrate 250 which includes an n-type semiconductor substrate 201, buried insulator layer 202, and p-type semiconductor substrate layer 203. In the substrate 250, isolation trench structures are formed around the active diode area with patterned shallow trench isolation structure 213-216 and deep trench isolation structure 205 formed over the buried insulation layer 202. As will be appreciated, any desired technique may be used to form the isolation trench structures, such as selectively etching and filling trench openings with one or more dielectric materials. However, the positioning of the STI structures 213-216 is controlled to place an STI structure (e.g., 214 and 215) between a cathode 241 and anode 240 and 242 so that the STI structure 215 is the only isolation between the cathode and anode contacts and is located over the p-n junction between the cathode and anode regions. The RESURF diode device 200 also includes an active area formed inside the isolation structure with one or more semiconductor layers 203 having a predetermined thickness and conductivity type (e.g., p-type). In the semiconductor layer 203, anode and cathode regions are separately formed to define a large p-n junction area. In selected embodiments, the anode includes one or more p-type RESURF anode extension layers 206, 207 which are formed at the substrate surface over a buried n-type RESURF cathode extension layer 204 which extends completely across the isolation structure to contact the deep trench isolation structures 205. The RESURF anode extension layers 206, 207 may be formed as a p-well region using a first implant mask to selectively diffuse or implant p-type impurities into the substrate 250 to a predetermined implant energy and dopant concentration so as to be located in an upper portion of the substrate 250 and around the subsequently formed P+ anode contact region(s) 230, 232, but not under the cathode active area around the subsequently formed N+ cathode contact region(s) 231. In similar fashion, the RESURF cathode extension layer 204 may be formed as an n-well region by diffusing or implanting n-type impurities into the substrate 250 to a predetermined implant energy and dopant concentration so as to overlap with and extend laterally below the anode extension region(s) 206, 207. In embodiments where no implant mask is used for the n-well implant, the resulting RESURF cathode extension layer 204 is located in an upper portion of the substrate 250 and around the subsequently formed N+ cathode contact region 231, and also extends under the RESURF anode extension layers 206, 207 and past the anode contact region(s) 230, 232 to make contact with the deep trench isolation structures 205. In this configuration, each p-type RESURF anode extension layer 206, 207 extends towards the cathode contact 231 and underneath an STI structure 214, 215 to help completely deplete the cathode extension region 204 under reverse bias.

With the configuration of the RESURF diode device 200, the STI regions 214, 215 provide the only isolation between the cathode contact 231 and anode contacts 230, 232, thereby providing a compact design with a small footprint as compared to conventional diode designs. In addition, RESURF action at the diode 200 is promoted by forming the anode extension regions 206, 207 with a p-well implant so as to be located in an upper substrate region in the anode active area and extend partway into the region between the cathode contact 231 and anode contacts 230, 232, creating a thin and lightly doped p-type region 206, 207 therebetween. The RESURF action at the diode 200 is further promoted by forming the buried cathode extension region 204 with an n-well implant so as to be located in an upper substrate region the cathode active area and the region between the cathode contact 231 and anode contacts 230, 232. In order to further enhance the breakdown voltage, the buried cathode extension region 204 extends beyond the anode active area 230, 232 to contact the deep trench isolation structures 205. The resulting n-type cathode extension region 204 and thin p-type region 206, 207 form a large p-n junction, and mutually deplete one another to help evenly distribute the potential over the junction, thereby increasing the breakdown voltage.

Though not required in every embodiment, the RESURF diode device 200 may also include one or more poly gate electrodes 220, 221 which are patterned and positioned on top of the STI regions 214, 215 between the cathode and anode contacts so as to cover the lateral p-n junction formed with the cathode 204 and anode regions 206, 207. By applying a bias voltage from either the anode or cathode potential to the poly gate electrodes 220, 221, the breakdown voltage of the diode may be further increased.

As described herein, the disclosed RESURF diode structures use overlapping cathode and anode regions which may be implemented with an efficient and compact layout by separating the anode and cathode contacts with only a shallow trench isolation region. Additional layout efficiencies may be obtained by symmetrically disposing the cathode and anode regions in relation to one another. To illustrate selected embodiments of such a symmetrical arrangement, reference is now made to FIGS. 3-4 which show plan layout views 300, 400 of the high voltage diode devices depicted in FIGS. 1-2, respectively.

Figure 3:
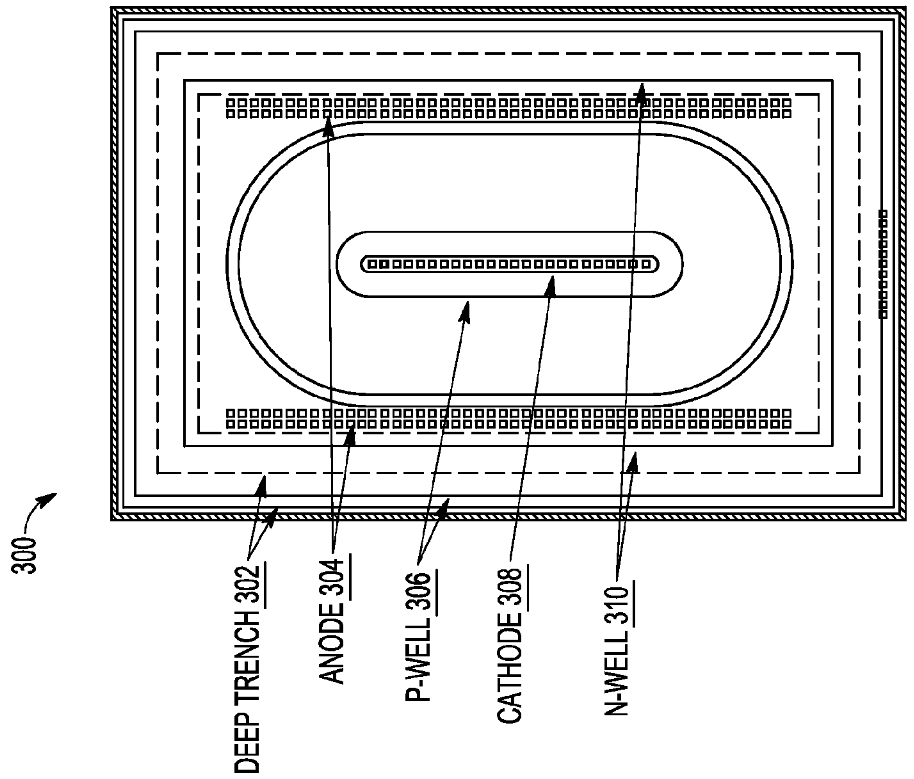

In particular, the plan layout view 300 of FIG. 3 shows a plan layout view of the high voltage RESURF diode device 100 depicted in FIG. 1 (without the poly gates positioned on top of STI regions 114 and 115) which includes an active area having elliptical anode contact regions 304 that are symmetrically disposed about a central linear cathode contact region 308. As illustrated, the shorter cathode contact region 308 is positioned in relation to the longer anode contact regions 304 to be separated by a shallow trench isolation region (not shown), though other relative positioning and lengths may be used. The plan layout view 300 also shows a deep trench mask region for the outer deep trench region 302 that is formed at the periphery of the RESURF diode device 100 to surround and isolate the anode and cathode contact regions 304, 308. In the depicted example, the deep trench mask region masks the entire diode area except for a peripheral section at the sides of the active area. Overlapping with the anode contact regions 304, a first mask region for p-well region 306 is symmetrically disposed to form an anode extension region which extends from the deep trench region 302 and partway to the cathode contact region 308. The plan layout view 300 also shows an additional mask region for an n-well region 310 that is symmetrically disposed to form a cathode extension region which overlaps with the cathode contact region 308 and extends partway to the deep trench region 302. With this configuration, the entire cathode is surrounded on the top, bottom, and sides by the surrounding p-type anode and substrate regions to help distribute the potential evenly across a large distance, resulting in a high breakdown voltage (e.g., above 90V) due to mutual depletion between the cathode and surrounding p-type regions.

Figure 2:
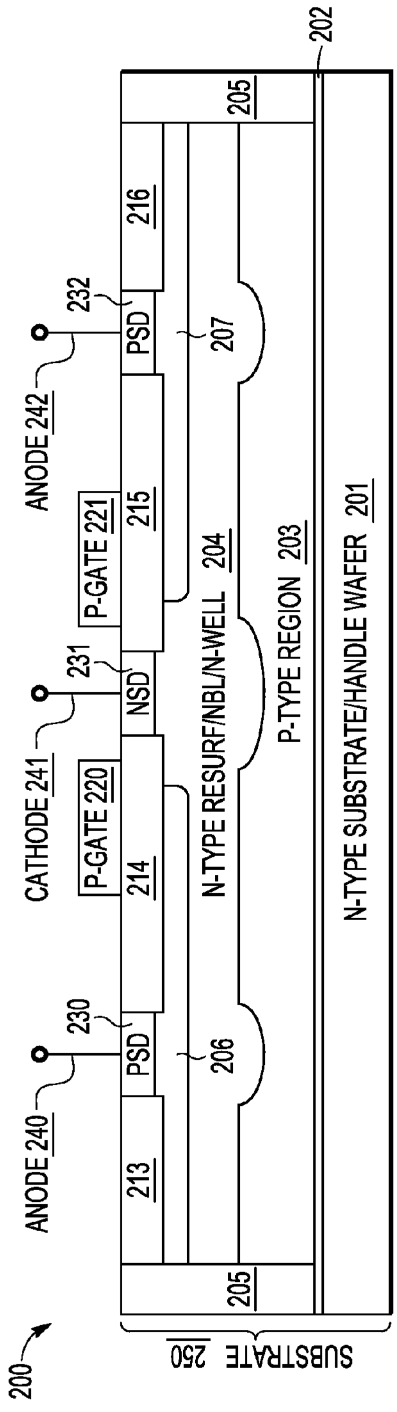
FIG. 2 is a partial cross-sectional view of a high voltage diode device having a RESURF anode extension structure formed over a cathode extension structure which extends past the anode contact to reach a deep trench isolation structure in accordance with selected embodiments of the present invention.
Figure 4:
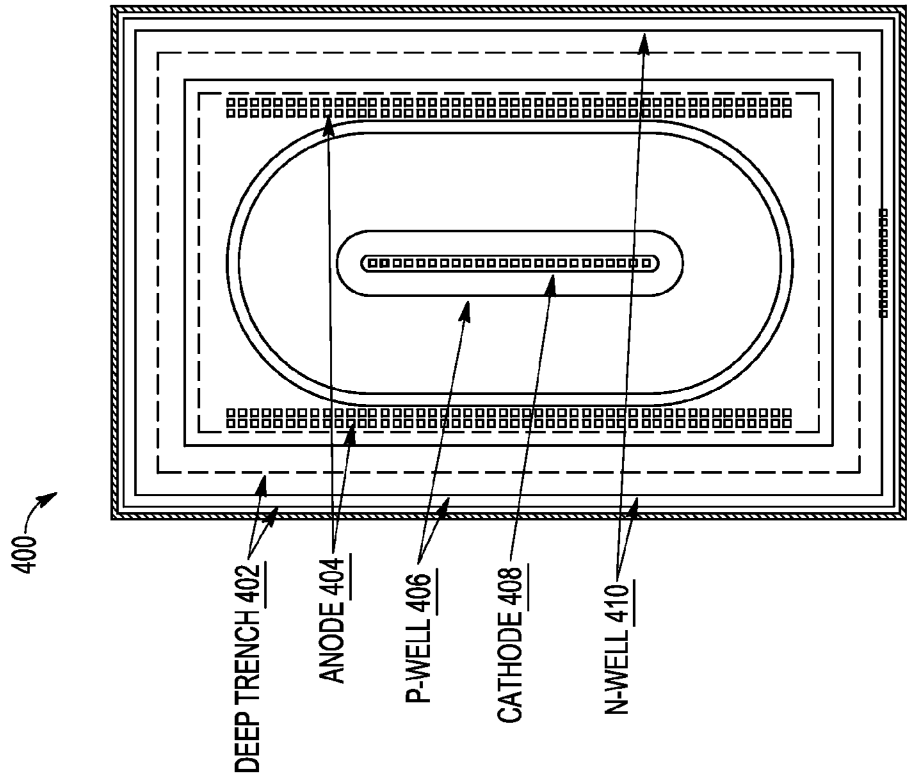
FIGS. 3-4 show plan layout views of the high voltage diode devices depicted in FIGS. 1-2, respectively.

To illustrate other embodiments, reference is now made to FIG. 4 which shows a plan layout view 400 of the high voltage RESURF diode device 200 depicted in FIG. 2 (without the poly gates positioned on top of STI regions 214 and 215) which includes elliptical anode contact regions 404 symmetrically disposed about a central linear cathode contact region 408. Again, the cathode contact region 408 may be positioned in relation to the anode contact regions 404 to be separated by a shallow trench isolation region (not shown), and to be surrounded by an outer deep trench region 402 that is formed at the periphery of the RESURF diode device 200. Overlapping with the anode contact regions 404, a first mask region for a p-well region 406 is symmetrically disposed to form an anode extension region which extends from the deep trench region 402 and partway to the cathode contact region 408. In addition, the plan layout view 400 shows an additional mask region for an n-well region 410 that is symmetrically disposed to form a cathode extension region which overlaps with the cathode contact region 408 and extends to the deep trench region 302. With this configuration, the cathode is surrounded on the top and bottom by the surrounding p-type anode and substrate regions, and contacts the deep trench isolation region on the side to help evenly distribute the potential across a large distance, resulting in a high breakdown voltage (e.g., above 90V) due to mutual depletion between the cathode and anode regions. However, it will be appreciated that other layout configurations could be used to form the RESURF diode. For example, the diode may have linear anode and cathode contact regions. In other embodiments, the p-well implant and the n-well regions may be formed with rectangular or ring-shaped implant masks with round, shaved, or right corners.

Figure 5:
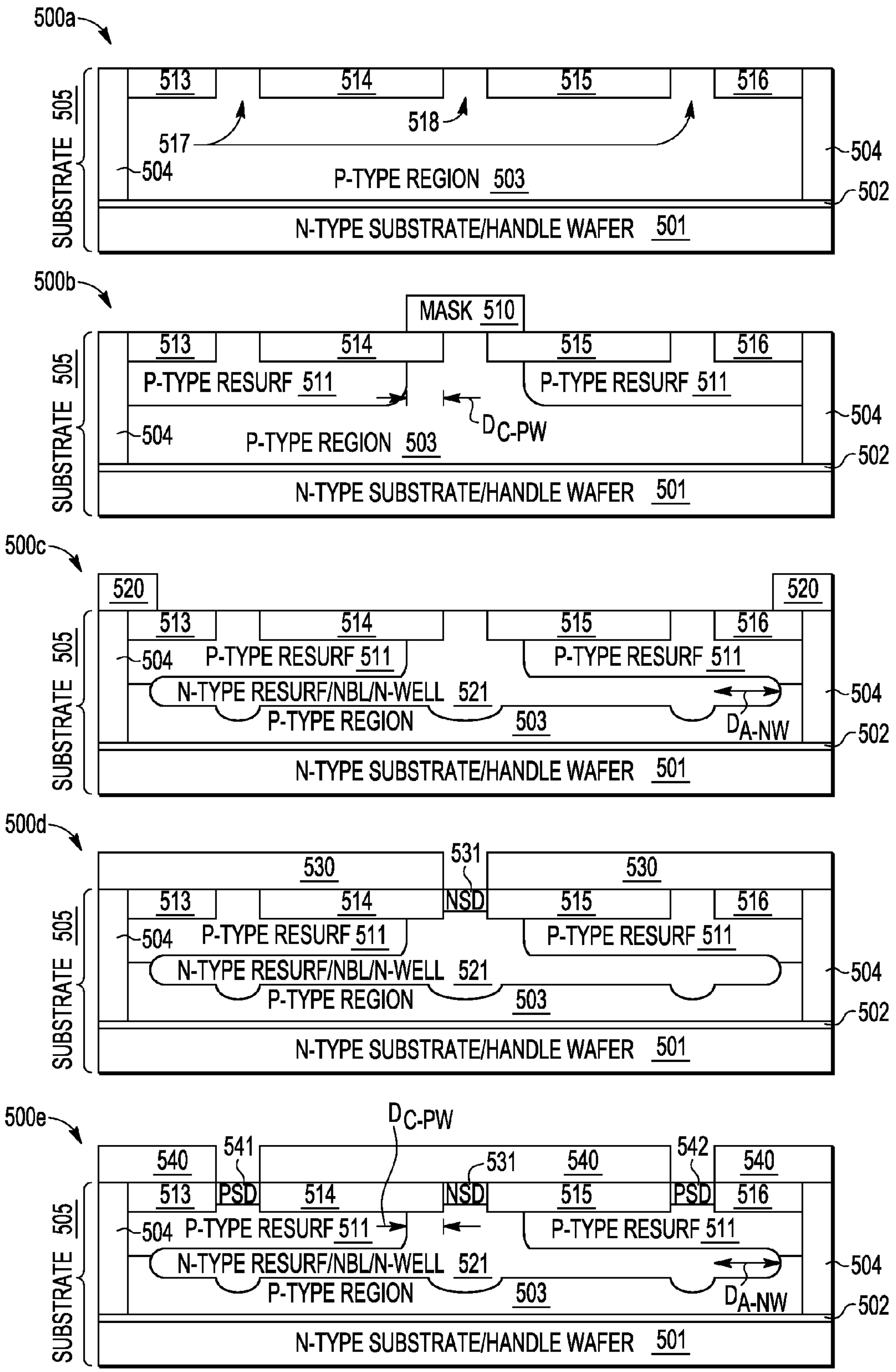
FIG. 5 is a diagrammatic cross-sectional depiction of various manufacturing process steps which may be used to form a high voltage RESURF diode device in accordance with various embodiments of the present invention.

The manufacturing process for fabricating high voltage RESURF diodes may include further processes that are commonplace in the environment of manufacturing a semiconductor package. For example, FIG. 5 shows diagrammatic cross-sectional depiction of various manufacturing process steps 500*a-e* which may be used to form a high voltage RESURF diode device without the poly gates positioned above the STI regions between the anode and cathode contacts. As depicted in cross-sectional view 500*a*, an SOI substrate 505 is provided which includes an n-type substrate or handling wafer 501, a buried insulator or oxide layer 502, and isolated active p-type region 503. The isolated active p-type region 503 is formed on the buried insulator or oxide layer 502, is surrounded on the sides by deep trench isolation structures 504, and is covered by shallow trench isolation structures 513-516 which are patterned to define anode 517 and cathode 518 contact regions.

As shown in cross-sectional view 500*b*, a first patterned implant mask 510 is defined to protect the cathode active area during a p-well implant which penetrates the unmasked STI structures 513-516 to form a p-type RESURF region 511 in the anode active area and the region adjacent to the deep trench isolation structures 504. The implanted p-well region 511 also extends below the STI structures 514, 515 between the anode 517 and cathode 518 contact regions to define a first design parameter ($D_{C-PW}$) for the spacing distance from the cathode contact to the p-type RESURF region 511.

As shown in cross-sectional vim 500*c*, a second patterned implant mask 520 is defined to protect the peripheral regions adjacent to the deep trench isolation structures 504 during an n-well implant which penetrates the unmasked STI structures 513-516 to form a buried n-type RESURF region 521 in the cathode active area and the region below the p-type RESURF region 511 so as to extend only part way to the deep trench isolation structures 504. At the surface near the cathode active area, the implanted n-type RESURF region 521 may extend beyond the STI structures 514, 515 between the anode 517 and cathode 518 contact regions. In addition, the implanted n-well region 521 can extend below the STI structures 514 and 515, or below the anode contact regions 517, or beyond the anode contact regions 517 to help define the second design parameter ($D_{A-NW}$) for the n-well region 521 enclosure of the peripheral edge of anode contact. Though not shown in the cross-sectional view 500*c*, it will be appreciated that the peripheral edge of the n-well region 521 may extend to contact the deep trench isolation structures 504 if the second patterned implant mask 520 is not used. By implanting n-type impurities through the patterned (STI) structures 513-516, the resulting profile of the buried cathode extension region 521 may include profile bulges below the cathode active region, and in the absence of any previous counter-doping below cathode contact region 518, the implanted buried cathode extension region 521 includes an upper portion in the substrate 505 around the subsequently formed N+ cathode contact region(s).

As shown in cross-sectional view 500*d*, a third patterned implant mask 530 is defined to implant the n-type cathode contact regions 531 while protecting or masking the remainder of the active area. The implanted cathode contact regions 531 help define the first design parameter ($D_{C-PW}$). In addition and as shown in cross-sectional view 500*c*, a fourth patterned implant mask 540 is defined to implant the p-type anode contact regions 541, 542 while protecting or masking the remainder of the active area. The implanted anode contact regions 541, 542 help define the second design parameter ($D_{A-NW}$).

By properly locating the arrangement of the thin and lightly doped p-type anode extension region 511 between the cathode and anode contacts 540, 541, the resulting first design parameter ($D_{C-PW}$) may be controlled to increase the breakdown voltage performance, where excessively large spacing distances (e.g., above 2.5 um) or small spacing distances (e.g., less than 0.25 um) for the design parameter $D_{C-PW}$ will lower the breakdown voltage. In addition, the breakdown voltage performance may also be increased by positioning the cathode extension region 521 in relation to the anode contact so that second design parameter ($D_{A-NW}$) is greater than 0 um. Another design parameter for increasing the breakdown voltage is to increase the thickness of the deep trench isolation structures 504. In addition, a poly gate can be located on top of the STI structures 514 and 515 to cover the p-n junction formed with the anode and cathode regions. The poly gate could be biased with the anode or cathode potential.

Figure 6:
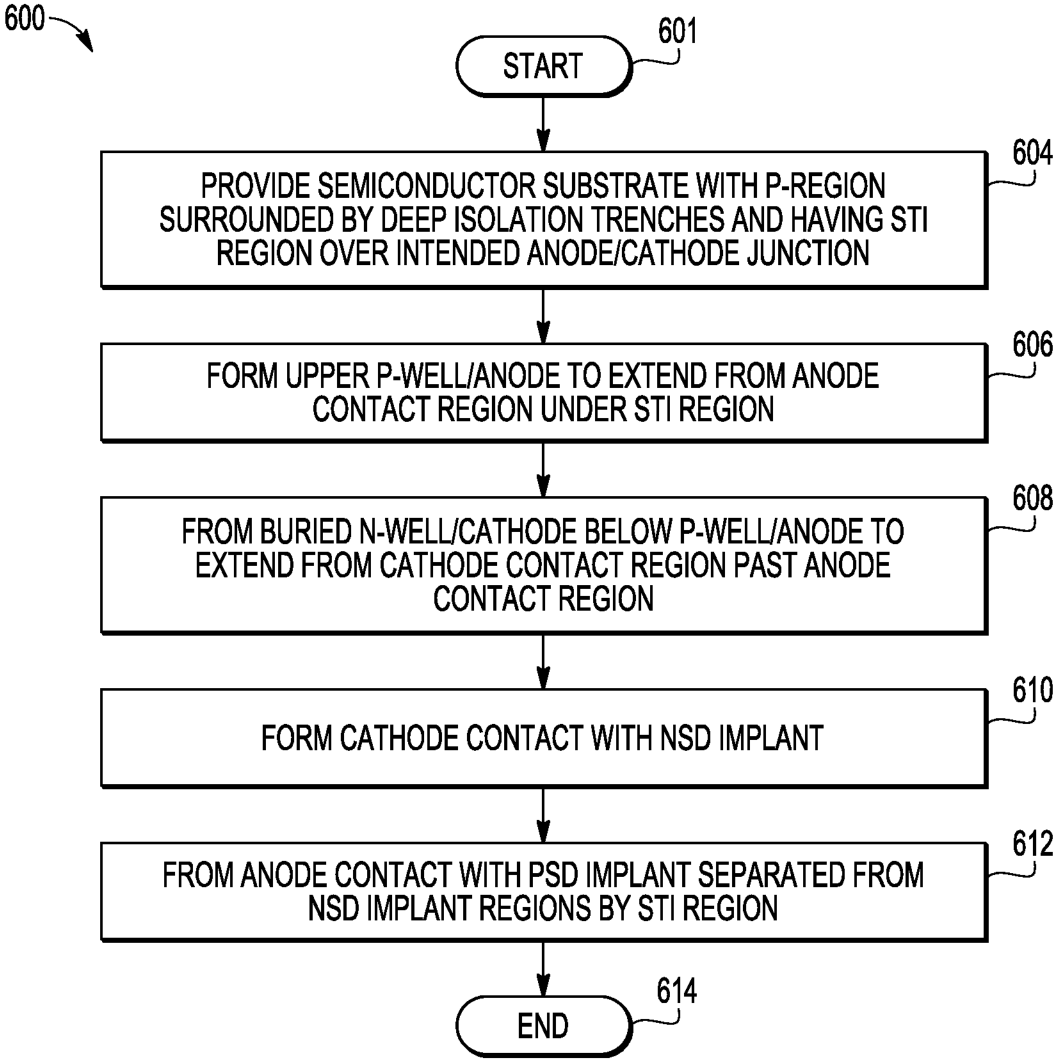
FIG. 6 is a simplified schematic flow chart illustrating various methods for fabricating high voltage RESURF diode devices in accordance with selected embodiments of the invention.

Turning now to FIG. 6, there is depicted a simplified schematic flow chart illustrating a method 600 for fabricating high voltage RESURF diode devices without the poly gates positioned above the STI regions between the anode and cathode contacts. In describing the fabrication methodology 600, various reference numbers, doping types and concentrations are provided by way of examples of different regions that can be formed, but this is intended merely to facilitate understanding of various exemplary embodiments and not by way of limitation. Once the fabrication methodology starts (step 602), a semiconductor substrate is provided at step 604 which has a first semiconductor region that is surrounded by deep trench isolation regions and covered by patterned shallow trench isolation structure(s) over the intended anode/cathode surface junction(s). The first semiconductor region may be a p-type region having a specified doping concentration (e.g., approximately 2E15 $cm^{-3}$). Unless otherwise indicated, subsequent steps may be provided in any desired order.

In the first semiconductor region, one or more RESURF and/or buried layers may be formed to define overlapping anode and cathode regions of the high voltage RESURF diode device. Starting with step 606, a first p-type RESURF layer may be formed as part of the anode. In an example embodiment, the p-type RESURF layer is formed with an implant of p-type impurities at a specified doping concentration (e.g., 1E16 to 1E19 $cm^{-3}$) to form a thin and lightly doped p-type region between the cathode and anode contacts, and between the anode contacts and deep trench isolation, where the implantation is masked to prevent p-type impurities from reaching the substrate surface near the cathode active area.

At step 608, a second n-type RESURF layer may be formed as part of the cathode to extend from the intended cathode contact region, and at least partway toward the deep trench isolation regions. In an example embodiment, the n-type RESURF layer is formed with an implant of n-type impurities at a specified dopant concentration (e.g., 5E15 to 5E17 $cm^{-1}$) so as to overlap with and extend laterally below the anode extension region(s).

At step 610, implant masks are used to form cathode contact regions proximate to the upper surface of the substrate, such as by implanting impurities of a second conductivity type (e.g., N-type) at a predetermined doping concentration (e.g., N++). As formed, the cathode contact regions are located to be completely contained within the second n-type RESURF layer. At step 612, implant masks are used to form anode contact regions proximate to the upper surface of the substrate, such as by implanting impurities of the first conductivity type (e.g., P-type) at a predetermined doping concentration (e.g., P++). As formed, the anode contact regions are located to be completely contained within the first p-type RESURF layer. In addition, the anode and cathode contact regions are positioned so that they are spaced apart from one another and separated by a shallow trench isolation structure. As depicted, the fabrication methodology 600 ends at step 614.

By now it should be appreciated that there is provided herein a semiconductor diode device and method for fabricating same. The disclosed diode device includes a semiconductor substrate region of a first conductivity type (e.g., an SOI substrate) and an isolation structure for electrically isolating the semiconductor substrate region, where the isolation structure includes a deep trench isolation region formed to surround the semiconductor substrate region and at least a first shallow trench isolation region formed on a surface of the semiconductor substrate region. In the semiconductor substrate region, there is formed a heavily doped first terminal contact region of the first conductivity type (e.g., p-type) and a heavily doped second terminal contact region of a second conductivity type (e.g., n-type) which is spaced apart from the heavily doped first terminal contact region. In addition, a first terminal extension region of the first conductivity type is formed in the semiconductor substrate region to surround the heavily doped first terminal contact region and to extend partway to the heavily doped second terminal contact region, and a second terminal extension region of the second conductivity type is formed in the semiconductor substrate region to surround the heavily doped second terminal contact region and to extend below the first terminal extension region to at least the STI structures between the first terminal and second terminal contacts. In selected embodiments, the first terminal extension region is formed as a p-type region at a surface of the semiconductor substrate region between the heavily doped first terminal and second terminal contact regions. In addition, the second terminal extension region may be formed as a buried n-type region which extends beyond the heavily doped second terminal contact region so that, in some embodiments, it contacts the deep trench isolation region, while in other embodiments, it does not contact the deep trench isolation region. As a result, the first terminal extension region and second terminal extension region form a p-n junction at a surface of the semiconductor substrate region that is located below the first shallow trench isolation region. In addition, the first terminal extension region may be formed to overlap with the second terminal extension region to form a p-n junction such that the first terminal extension region and second terminal extension region mutually deplete each other. Finally, the second terminal extension region may be formed so that it is surrounded by the first terminal extension region and the p-type region from at least the top and the bottom. To further increase the breakdown voltage, a conductive electrode layer may be formed on the first shallow trench isolation region which is positioned over the lateral p-n junction formed at a surface of the semiconductor substrate region between the first terminal extension region and second terminal extension region. As will be appreciated, the resulting semiconductor diode device may include an anode terminal formed with first conductivity type regions and a cathode terminal formed with second conductivity type regions. Conversely, the semiconductor diode device may include a cathode terminal formed with first conductivity type regions and an anode terminal formed with second conductivity type regions.

In another form, there is provided a method of fabricating a semiconductor device. In the disclosed methodology, a semiconductor substrate region of a first conductivity type (e.g., p-type) is formed. In selected embodiments, the semiconductor substrate region may be formed within an isolation structure which has a deep trench isolation region formed to surround the semiconductor substrate region, a buried insulator layer formed at the bottom of the semiconductor substrate region, and at least a first shallow trench isolation region formed on a surface of the semiconductor substrate region. In the semiconductor substrate region, a heavily doped cathode contact region of a second conductivity type may be formed. In addition, a cathode extension region of the second conductivity type may (e.g., an n-type RESURF layer) be formed in the semiconductor substrate region to surround the heavily doped cathode contact region, where the cathode extension region comprises a peripheral end portion that extends laterally past the heavily doped cathode contact region. In selected embodiments, the cathode extension region is surrounded by the anode extension region and the p-type region from at least the top and the bottom. In the semiconductor substrate region, an anode extension region of the first conductivity type (e.g., a p-type RESURF layer) may also be formed to surround the heavily doped anode contact region and to extend above the peripheral end portion of the n-type cathode extension region part way to the heavily doped cathode contact region, thereby forming a lateral p-n junction at the surface of the semiconductor substrate region between the anode extension region and cathode extension region and below a shallow trench isolation region formed on a surface of the semiconductor substrate region. In selected embodiments, the anode extension region may be formed by implanting the anode extension region with an implant mask so that the anode extension region is separated from the heavily doped cathode contact region by a first lateral spacing dimension that is controlled to maximize breakdown voltage for the semiconductor device.

In yet another form, there is provided a method forming a high voltage diode device comprising a first terminal (e.g. anode) and second terminal (e.g. cathode). In the disclosed methodology, a semiconductor-on-insulator substrate is provided that includes a substrate layer formed over a buried insulator layer and surrounded by a deep trench isolation region. On the substrate layer, shallow trench isolation regions are formed to define a cathode contact opening separated from an anode contact opening by a first shallow trench isolation region. In any desired order, the following steps are applied. In the cathode contact opening, a heavily doped n-type cathode contact region may be selectively implanted into the substrate layer. In addition, an n-type cathode extension region may be selectively implanted in the substrate layer to surround the heavily doped cathode contact region, where the n-type cathode extension region comprises a peripheral end portion that extends laterally past the heavily doped n-type cathode contact region and at least as far as the anode contact opening. In selected embodiments, the selectively implanted n-type cathode extension region may be implanted so that the peripheral end portion extends to contact the deep trench isolation region. In addition, a heavily doped p-type anode contact region may be selectively implanted in the anode contact area of the substrate layer to be spaced apart from the heavily doped n-type cathode contact region. In addition, a peripheral p-type anode well region may be selectively implanted in the substrate layer, where the peripheral p-type anode well region extends laterally above the peripheral end portion of the n-type cathode extension region and toward the heavily doped n-type cathode contact region, thereby forming a lateral p-n junction at the surface of the substrate layer below the first shallow trench isolation region. In addition, a conductive electrode layer (e.g., patterned poly) may be formed on the first shallow trench isolation region which is positioned over the lateral p-n junction formed at a surface of the substrate layer.

Although the described exemplary embodiments disclosed herein are directed to various high voltage RESURF diode devices and methods for making same, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various diode devices are illustrated as being formed in a p-type substrate layer, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions may be substituted in order to form devices of opposite conduction type. Moreover, the thicknesses and doping concentrations of the described layers may deviate from the disclosed ranges or values. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of fabricating a high voltage semiconductor diode device, comprising in any order:

forming a heavily doped second terminal contact region of a second conductivity type in a semiconductor substrate region;

forming a second terminal extension region of the second conductivity type in the semiconductor substrate region with an upper portion around the heavily doped second terminal contact region, where the second terminal extension region comprises a buried RESURF extension region that extends laterally past the heavily doped second terminal contact region;

forming a heavily doped first terminal contact region of a first conductivity type in a first terminal contact area of the semiconductor substrate region to be spaced apart from the heavily doped second terminal contact region; and forming a first terminal extension region of the first conductivity type in the semiconductor substrate region around the heavily doped first terminal contact region, the first terminal extension region located above the buried RESURF extension region and extending part way toward the heavily doped second terminal contact region without reaching the heavily doped second terminal contact region, thereby forming a lateral p-n junction at the surface of the semiconductor substrate region between the first terminal extension region and the upper portion of the second terminal extension region at a lateral spacing distance from the heavily doped second terminal contact region and below a shallow trench isolation region formed on a surface of the semiconductor substrate region, where the buried RESURF extension region extends laterally beyond the heavily doped first terminal contact region without reaching a deep trench isolation region.

2. The method of claim 1, where the second terminal extension region is surrounded by the first terminal extension region and a semiconductor region of the first conductivity type from at least the top and the bottom.

3. The method of claim 1, where forming the semiconductor substrate region comprises forming the semiconductor substrate region within an isolation structure comprising the deep trench isolation region formed to surround the semiconductor substrate region, a buried insulator layer formed at the bottom of the semiconductor substrate region, and the shallow trench isolation region formed on the surface of the semiconductor substrate region.

4. The method of claim 1, where forming the first terminal extension region comprises implanting the first terminal extension region with an implant mask so that the first terminal extension region is separated from the heavily doped second terminal contact region by a first lateral spacing dimension that is controlled to maximize breakdown voltage for the semiconductor device.

5. The method of claim 2, where forming the first terminal extension region comprises forming a p-type RESURF layer or an n-type RESURF layer, and where forming the second terminal extension region comprises forming an n-type RESURF layer or a p-type RESURF layer.

6. A method for forming a high voltage diode device, comprising:

providing a semiconductor-on-insulator substrate comprising a substrate layer formed over a buried insulator layer and surrounded by a deep trench isolation region;

forming shallow trench isolation regions on the substrate layer to define a second terminal contact opening separated from a first terminal contact opening by a first shallow trench isolation region; and then, in any order:

selectively implanting a heavily doped second terminal contact region of a second conductivity type in the substrate layer in the second terminal contact opening;

selectively implanting a second terminal extension region of the second conductivity type in the substrate layer with an upper portion around the heavily doped second terminal contact region, where the second terminal extension region comprises a buried RESURF extension region that extends laterally past the heavily doped second terminal contact region;

selectively implanting a heavily doped first terminal contact region of a first conductivity type in the first terminal contact opening of the substrate layer to be spaced apart from the heavily doped second terminal contact region; and selectively implanting a peripheral first terminal well region of the first conductivity type in the substrate layer, where the peripheral first terminal well region extends laterally above the buried RESURF extension region of the second terminal extension region and toward the heavily doped second terminal contact region without reaching the heavily doped second terminal contact region, and wherein the peripheral first terminal well region and the upper portion of the second terminal extension region form a lateral p-n junction at a lateral spacing distance from the heavily doped second terminal contact region at the surface of the substrate layer below the first shallow trench isolation region, where the buried RESURF extension region extends laterally beyond the heavily doped first terminal contact region without reaching the deep trench isolation region.

7. The method of claim 6, further comprising forming a conductive electrode layer on the first shallow trench isolation region which is positioned over the lateral p-n junction formed at the surface of the substrate layer.

8. The method of claim 6, where regions formed with material of the first conductivity type are formed as p-type regions, and where regions formed with material of the second conductivity type are formed as n-type regions, respectively.

9. The method of claim 6, where the heavily doped first terminal contact region and peripheral first terminal well region form an anode terminal or a cathode terminal, and where the heavily doped second terminal contact region and second terminal extension region form a cathode terminal or an anode terminal.

* * * * *